(12) United States Patent
Kuo et al.

(10) Patent No.: US 8,356,221 B2
(45) Date of Patent: Jan. 15, 2013

(54) TRANSITION DELAY TEST FUNCTION LOGIC

(75) Inventors: Mark T. Kuo, Fremont, CA (US);
Michael Howard, San Jose, CA (US);
Daniel C. Murray, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 371 days.

(21) Appl. No.: 12/861,991

(22) Filed: Aug. 24, 2010

(65) Prior Publication Data

US 2012/0054568 A1 Mar. 1, 2012

(51) Int. Cl.
*G01R 31/28* (2006.01)

(52) U.S. Cl. ........................................................ 714/731

(58) Field of Classification Search .................. 714/726, 714/731
See application file for complete search history.

(56) References Cited

U.S. PATENT DOCUMENTS

| | | | |
|---|---|---|---|
| 5,896,396 A | 4/1999 | Sanghani et al. | |
| 6,141,271 A | 10/2000 | Yoon et al. | |
| 6,453,436 B1 | 9/2002 | Rizzolo et al. | |
| 7,702,980 B2 | 4/2010 | Chen | |
| 7,793,179 B2* | 9/2010 | Sul | 714/726 |
| 2004/0041610 A1* | 3/2004 | Kundu | 327/215 |
| 2005/0050415 A1* | 3/2005 | Anand et al. | 714/726 |
| 2006/0129900 A1* | 6/2006 | Clark | 714/726 |
| 2009/0177934 A1 | 7/2009 | Irby et al. | |

* cited by examiner

*Primary Examiner* — Scott Baderman
*Assistant Examiner* — Neil Miles
(74) *Attorney, Agent, or Firm* — Lawrence J. Merkel; Meyertons, Hood, Kivlin, Kowert & Goetzel, P.C.

(57) ABSTRACT

A method and apparatus for conducting transition testing using scan elements are disclosed. In one embodiment, an integrated circuit (IC) includes a scan chain having first and second subsets of scannable flops, the first subset having respective data inputs coupled to a memory array. The scannable flops of the second subset may each have a respective data input coupled to circuitry other than the memory array (e.g., to a logic circuit). The scannable flops of the first subset may be enabled for scan shifting during a transition test mode. The scannable flops of the second subset are inhibited from scanning during the transition test mode. The transition test mode may include at least two functional clock cycles in which the scannable flops of the first subset provide complementary first and second logic values to logic circuits coupled to respective data outputs.

25 Claims, 7 Drawing Sheets

TRANSITION DELAY TEST FUNCTION LOGIC

BACKGROUND

1. Field of the Invention

This invention relates to integrated circuits, and more particularly, to scan testing of integrated circuits.

2. Description of the Related Art

Subsequent to manufacture and prior to shipping, integrated circuits (IC's) may be tested to verify their functionality. One type of testing that may be conducted is known as scan testing. To conduct a scan test, test stimulus data may be input into an IC through a serially coupled chain of scannable elements. Each scannable element may include a data input, a scan data input, a data output, and a scan data output. The scan data output of all but the last scannable element may be coupled to the scan data input of a next scannable element. Test stimulus data may be shifted into each scannable element through its scan data input, and applied to logic circuitry (e.g., combinational logic) via its data output. Test stimulus data may be applied to the logic circuitry responsive to a first cycle of a clock signal, sometimes referred to as a launch cycle. Test result data may be captured responsive to a second cycle of the clock signal (sometimes referred to as a capture cycle) on the data input of the scannable element. Subsequent to capture, the test result data may be shifted through the scan chain via the scan data input and scan data output of each scan chain.

Using scan testing, different types of tests may be conducted. One type of testing is known as transition testing, which may test whether the outputs of certain logic circuits may make a logical transition, either from a logic 0 to a logic 1, from a logic 1 to a logic 0, or both. Some delay tests, such as transition delay fault tests, may require the application of test stimulus data for two or more consecutive clock cycles at an operational clock speed in order to ensure that both logical transitions may occur as intended.

Many IC's include one or more memory arrays. The read ports of some of these memory arrays may be coupled to the data input of each of a number of scannable elements. However, the data stored in the memory arrays during scan testing is typically indeterminate. Because of this arrangement, transition testing of combinational logic circuitry coupled to the output of such scannable elements may require bypass circuitry. Bypass circuitry may be implemented using a multiplexer coupled to the data input of such scannable elements. This may in turn enable at-speed transition testing of scannable elements having data inputs that are otherwise coupled to read port outputs of a memory array, as the read port outputs may be bypassed by selecting the output of another scannable element coupled to the multiplexer. These multiplexers introduce additional circuitry that may add delay to the path between the read port output and the scannable elements.

SUMMARY

Various embodiments of a method and apparatus for conducting transition testing using scan elements are disclosed. In one embodiment, an integrated circuit (IC) includes a scan chain having first and second subsets of scannable flops, with the flops of the first subset having respective data inputs coupled to a memory array. The scannable flops of the second subset may each have a respective data input coupled to circuitry other than the memory array (e.g., to a logic circuit). The scannable flops of the first subset may be enabled for scan shifting during functional clock cycles of a transition test mode. The scannable flops of the second subset are inhibited from scanning during the functional clock cycles of the transition test mode. The transition test mode may include at least two functional clock cycles in which the scannable flops of the first subset provide complementary first and second logic values to logic circuits coupled to respective data outputs responsive to data scanned into the flops.

Each scannable flop of the scan chain may include a scan enable input. A logic circuit may be coupled to the scan enable input of each of the scannable flops of the first subset in one embodiment. During scan shifting operations (e.g., when test stimulus data is shifted into the IC), a signal may be asserted on the scan enable input of each of the scannable flops. During the functional clock cycles of the transition test mode, a signal may be provided to the logic circuit that causes assertion of a signal on scan enable inputs of the first subset of scannable flops. The signal on the scan enable input for each scannable flop of the second subset may remain deasserted during transition test mode operations.

As a result of the arrangement described herein, transition testing of logic circuits having inputs coupled to a memory array may be conducted. The arrangement may eliminate the requirement to use bypass circuitry in order to enable transition testing. The scannable flops of the first subset may, responsive to at-speed cycles of a functional clock, convey first and second logic values (e.g., a logic 1 followed by a logic 0) to logic circuits coupled to respective data outputs, thereby allowing at-speed testing for transition faults.

BRIEF DESCRIPTION OF THE DRAWINGS

The following detailed description makes reference to the accompanying drawings, which are now briefly described.

Figure 1:
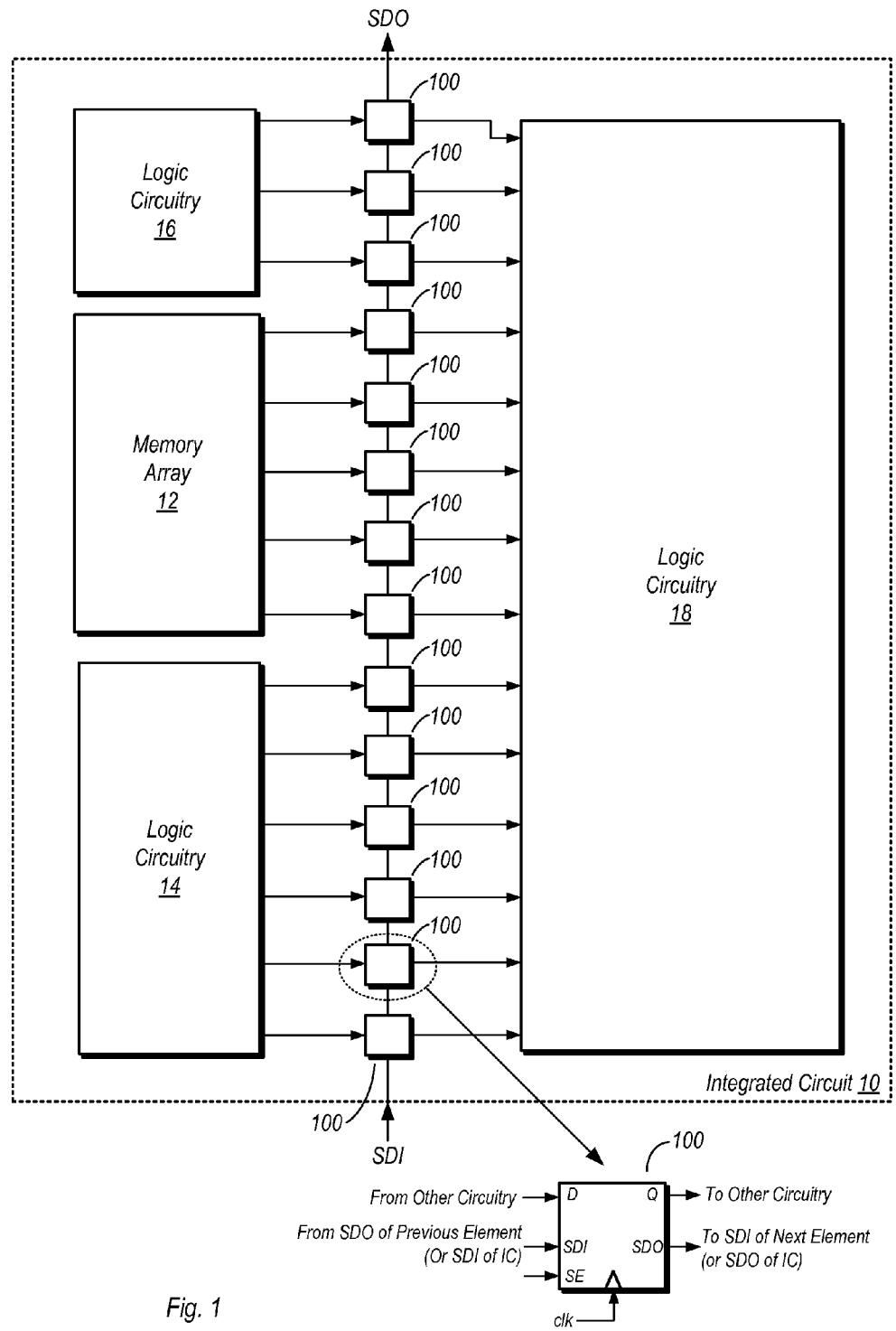
FIG. 1 is a block diagram of one embodiment of an integrated circuit (IC) having a scan chain.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit with Scan Chain:

FIG. 1 is a block diagram of one embodiment of an integrated circuit (IC) having a scan chain. In the embodiment shown, integrated circuit (IC) 10 includes logic circuits 14, 16, 18 and a memory array 12. Logic circuits 16, 14, and 18 may include various combinational logic circuits. Memory array 12 may be a memory implemented using any suitable type of memory circuitry (e.g., static random access memory, (SRAM)).

IC 10 may include one or more scan chains. In the embodiment of FIG. 1, a scan chain including a number of serially coupled scan elements 100 is shown. An exemplary one of scan elements 100 is also shown in the drawing as a D flip-flop. Each scan element 100 includes a 'D' input coupled to receive a data bit from other circuitry (e.g., from logic circuit 14), and a 'Q' output coupled to provide a data bit to other circuitry (e.g., to logic circuitry 18). During normal operations of IC 10, scan element 100 may receive data through the 'D' input and may provide data through the 'Q' output. Data may be received into or provided from scan element 100 in accordance with a clock signal ('clk'). During normal operations of IC 10, scan element 100 may be used as a retention flop that retains data generated by and/or to be received by other logic circuits.

Each scan element 100 in the embodiment shown is configured for scan test operations. To support scan testing, each of scan elements 100 includes a scan data input 'SDI', a scan data output 'SDO', and a scan enable input, 'SE'. The SDI terminal of each scan element 100, with the exception of the very first one in the chain, is coupled to the SDO terminal of the previous scan element 100. Thus, the SDO terminal of each scan element 100, except for the very last one in the chain, is coupled to the SDI terminal of the next scan element 100.

Various types of scan elements may be utilized to implement each scan element 100. Multiplexer-D and LSSD (level sensitive scan design) elements are both possible and contemplated for scan elements 100. In the case of where LSSD scan elements are used, no scan enable signal is required since scan elements of this type are clocked by two separate dedicated scan clocks. Accordingly, when implemented using LSSD scan elements, the subset of scan elements coupled to receive data from the memory array may be arranged such that there respectively received scan clock signals are toggled during transition testing. It is also noted that it is not necessary for each of scan elements 100 to be identical. Thus, scan chains including multiple types of scan elements are possible and contemplated.

Test stimulus data may input into IC 10 by providing it to the SDI terminal of the first scan element 100 in the chain and shifting the data from one scan element 100 to the next until each bit has reached its intended scan element. Shifting of data from one scan element 100 to the next may be enabled responsive to the assertion of a scan enable signal on the SE terminal of each of scan elements 100. Shifting may be synchronized with a clock signal that may be received on the 'clk' input of each scan element 100. The 'clk' input may also be used to receive the functional clock signal during normal operations of IC 10.

During the actual test operations, a scan element 100 may provide, via its Q output, a bit of test stimulus data to logic circuitry coupled thereto (e.g., from a scan element 100 to logic circuitry 18), responsive to a cycle of a functional clock signal. Test result data may be captured by a scan element 100, via its D input, from logic circuitry coupled thereto (e.g., from logic circuitry 16). Similarly, the outputs of the logic circuitry 18 may be input into other flops not explicitly shown in FIG. 1. The test result data may then be shifted from the scan chain in the same manner in which test stimulus data was shifted into IC 10. The test result data may be received by a test system via the SDO terminal of the last scan element 100 in the chain.

Figure 2A:
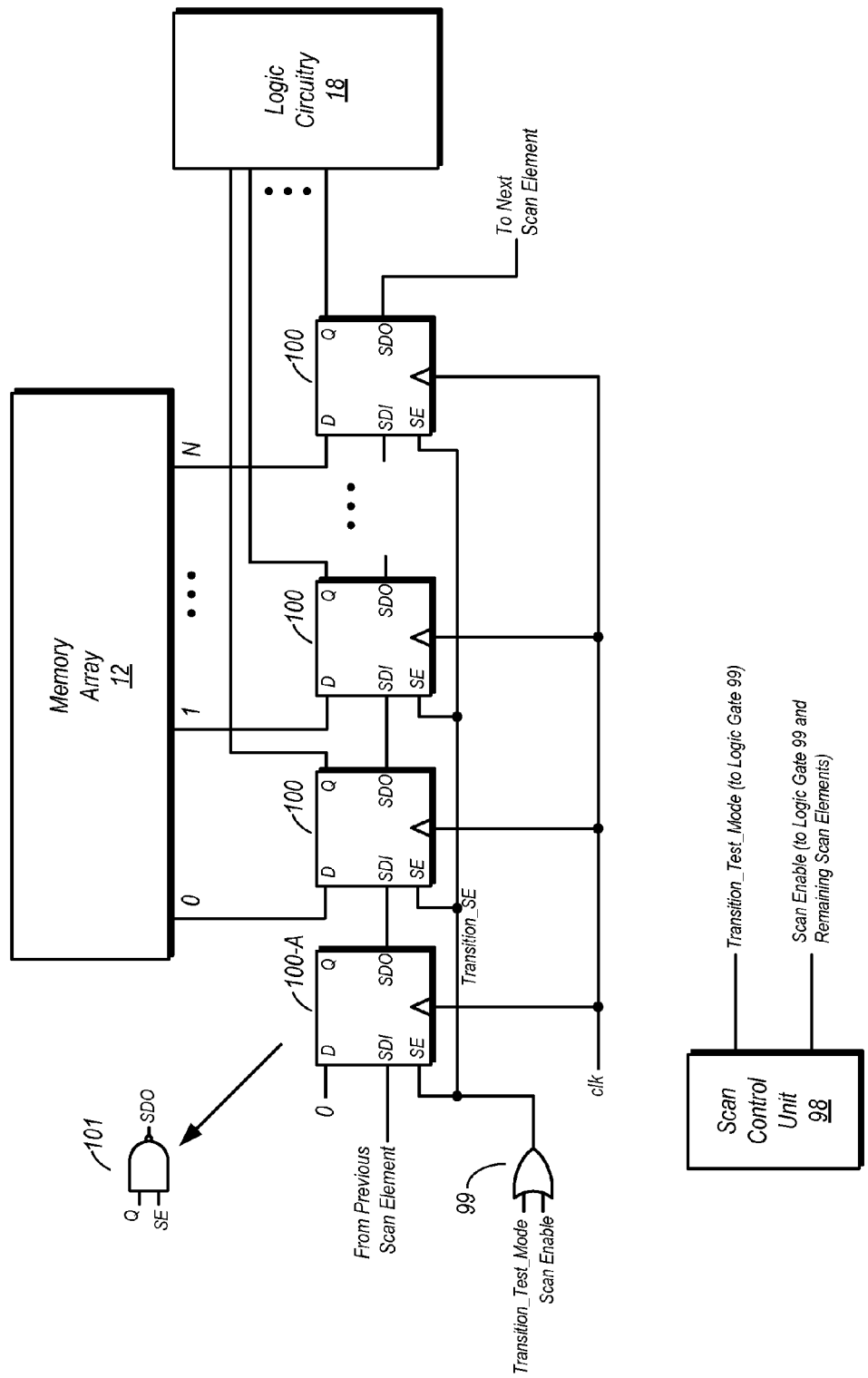
FIG. 2A is a logic diagram of one embodiment of a portion of a scan chain.
Figure 2B:
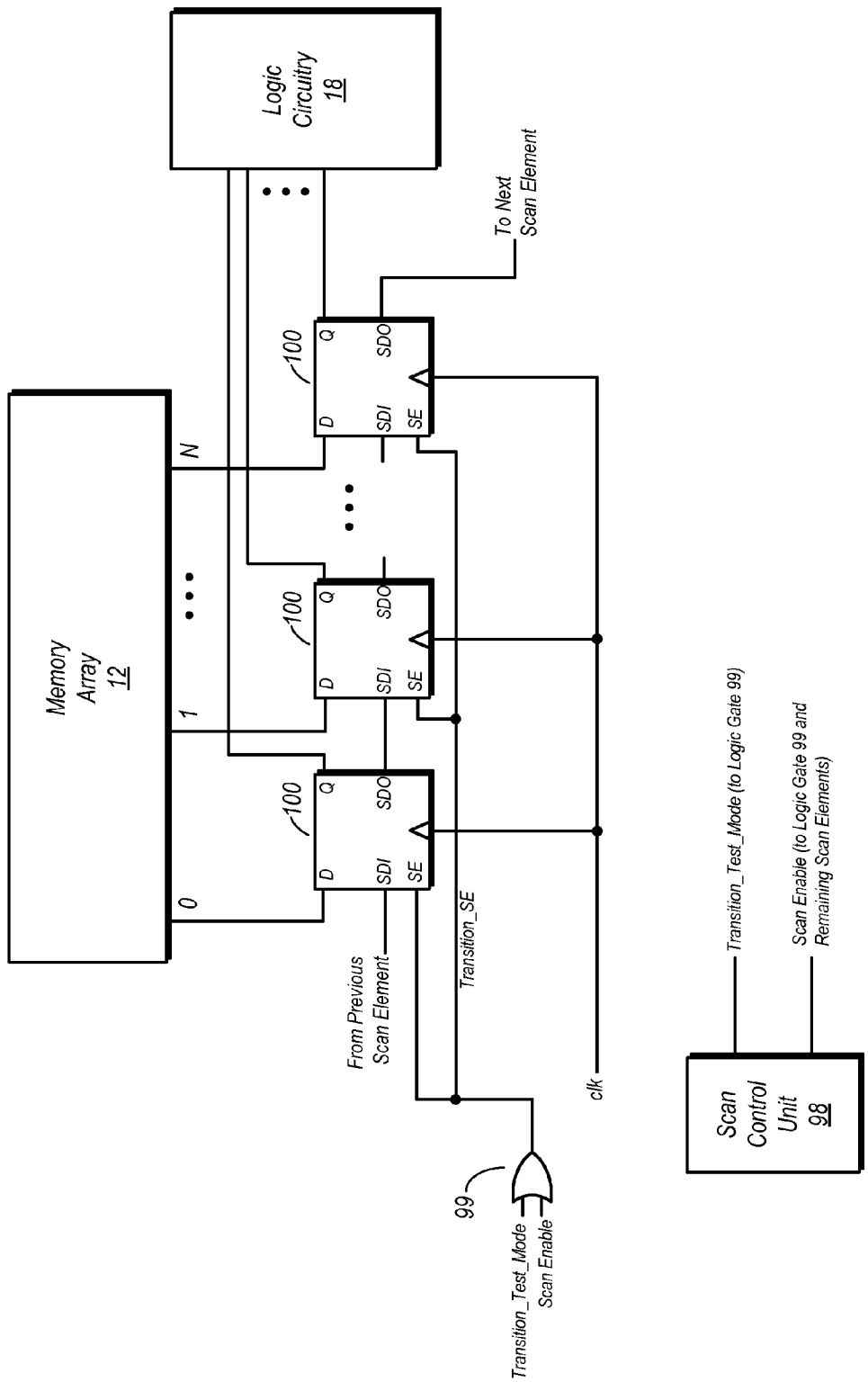
FIG. 2B is a logic diagram of another embodiment of a portion of a scan chain.
Figure 3:
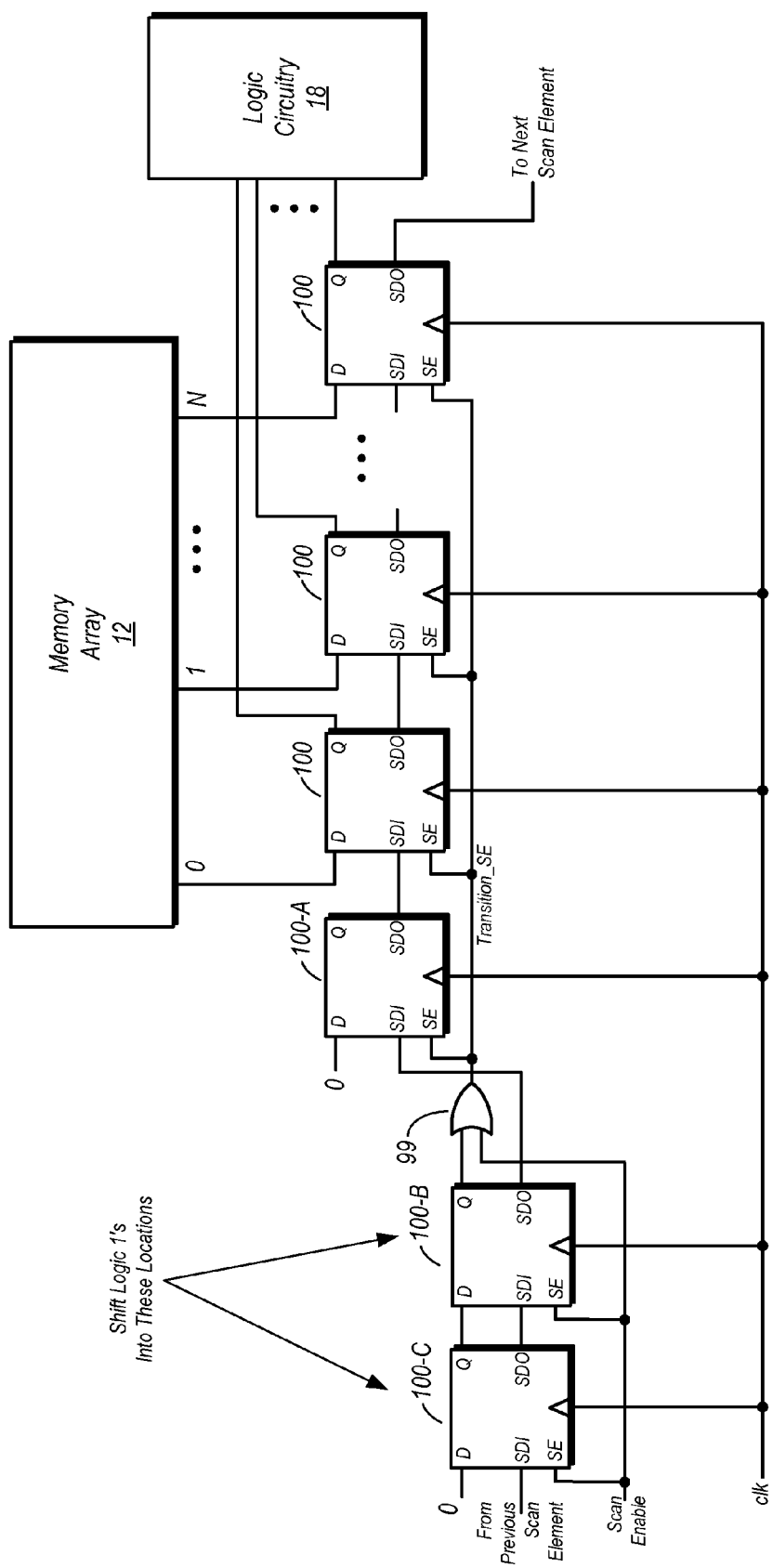
FIG. 3 is a logic diagram of another embodiment of a portion of a scan chain.

One type of testing that may be conducted using scan chains is transition testing. This type of testing may be used to test to determine whether or not outputs of logic circuits will perform logical transitions (i.e. 0 to 1 or 1 to 0) responsive to changing inputs intended to cause such a transition. Transition testing may require at least two clock cycles and a combinational depth of at least two bits. For the subset of scan elements 100 that are coupled to logic circuitry 14 and logic circuitry 16, this may be accomplished via logic values captured via their respective D inputs. However, the outputs of memory 12 may be indeterminate, and thus may not be suitable for use in transition testing. Without modification to the scan chain, transition testing of logic circuits coupled to the Q outputs of the subset of scan elements 100 coupled to memory array 12 may not be possible. FIGS. 2A, 2B and 3, which will now be discussed, illustrate embodiments of a modified scan chain in which such transition testing is enabled using the subset of scan elements 100 coupled to a memory array such as memory array 12.

Modified Scan Chains for Transition Testing:

FIG. 2A is a logic diagram of one embodiment of a portion of a scan chain. More particularly, FIG. 2A illustrates a portion of a modified scan chain in which a subset of scan elements 100 coupled to memory array 12 are enabled to provide test stimulus data for transition testing.

In the embodiment shown, all of scan elements 100 with the exception of scan element 100-A are coupled to receive data from memory array 12 via their respective D inputs. For each of scan elements 100 (including scan element 100-A), scan shifting may be enabled responsive to assertion of a signal on respective scan enable inputs. Scan element 100-A is provided in the embodiment shown as an extra scan element from which an opposite logic state may be shifted into the scan element 100 that is coupled to receive bit 0 from memory array 12 during the functional clock cycles of the transition test mode.

Control of scan operations, both during normal scan shifting as well as during the functional clock cycles of a transition test, may be provided by logic circuitry that includes scan control unit 98 (which is not explicitly shown, but may be present in IC 10 of FIG. 1) and logic gate 99. In this particular embodiment, the output of logic gate 99 (an OR gate in this instance) is coupled to the scan enable input of each of the scan elements 100 coupled to memory array 12 as well as scan element 100-A. Logic gate 99 may assert the transition scan enable ('Transition_SE') signal when one of two conditions occurs. The first of these conditions is the assertion of a scan enable signal. The scan enable signal may be asserted by scan control unit 98. The scan enable signal may be received by logic gate 99, and may also be received directly by those scan elements 100 that are not within the subset shown in FIG. 2A (i.e. scan elements 100 that are not coupled to receive the transition scan enable signal). When asserted, the scan enable signal may cause logic gate 99 to assert the transition scan enable signal provide to the subset of scan elements 100 shown in FIG. 2A. Scan control unit 98 may assert the scan enable signal during scan shifting operations, which may be performed both for the loading of test stimulus data into IC 10, as well as for the shifting out and recovery of captured test result data from IC 10. When scan shifting operations are complete, scan control unit 98 may deassert the scan enable signal.

Logic gate 99 may also assert the transition scan enable signal responsive to the transition test mode signal. The transition test mode signal may be asserted by scan control unit 98 when transition testing is to be performed. Scan control unit 98 may hold the scan enable signal in an inactive (deasserted) state during the functional clock cycles of transition mode testing. Thus, scan shifting may be disabled during the functional clock cycles of a transition test for those scan elements 100 that are not coupled to receive the transition test enable signal. However, assertion of the transition test mode signal by scan control unit 98 may cause logic circuit 99 to assert the transition test enable signal, and thus enable scan shifting during the functional clock cycles of a transition test for those scan elements 100 coupled to receive this signal, (e.g., scan elements 100 and 100-A shown in FIG. 2A). Accordingly, rather than capturing indeterminate memory read data during the functional clock cycles of a transition test, known data may be shifted into these scan elements for subsequent launch into logic circuitry 18. Furthermore, the ability to shift during the functional clock cycles of a transition test may in turn enable those scan elements 100 coupled to memory array 12 to launch a logical transition (i.e. logic 0 to logic 1 or logic 1 to logic 0) into logic circuitry (i.e. logic circuitry 18 in this embodiment) coupled to their respective Q outputs. More particularly, the ability to perform scan shifting during functional clock cycles occurring during transition testing may enable these scan elements to provide test stimulus having a combinational depth of at least two bits.

When shifting in test stimulus data for transition testing, a logic value may be shifted into the scan element 100-A that is opposite of the logic value shifted into the next scan element 100 (e.g., that which is coupled to receive bit 0 of memory array 12 in this embodiment). Thus, the initial logic value provided on the scan data output of scan element 100-A may be the complement of that provided on the Q output of the next scan element 100. Responsive to the first functional clock cycle of the transition test (the 'launch cycle'), this logic value may be shifted from scan element 100-A into the next scan element 100. Responsive to the next functional clock cycle of the transition test (the 'capture cycle'), the logic value shifted in from scan element 100-A may appear on the Q output of the next scan element 100. Thus, since the logic value appearing on the Q output during the capture cycle is opposite of that appearing on the Q output during the launch cycle, a logical transition is thus provided to logic circuitry 18.

Test stimulus data having a similar pattern (i.e. alternating 1's and 0's) may be loaded into the other ones of the memory-connected scan elements 100. Thus, each memory-connected scan element 100 may launch a first logic value into logic circuitry 18 during the first functional clock cycle of the transition test, and may launch a second, complementary logic value to logic circuitry 18 during the second functional clock cycle of the transition test. Multiple runs of a transition test may be conducted so that logic circuitry 18 is fully exercised and receives both logical transitions (i.e. 1 to 0 and 0 to 1) from each of the memory-connected scan elements 100.

As previously noted, IC 10 may include multiple scan chains. In one embodiment, test result data generated from applying the transition test stimulus may be captured by scan elements 100 of another scan chain and shifted from IC 10 for observation and analysis. In another embodiment, test result data may be captured by other scan elements 100 of the same scan chain. Embodiments wherein some of the data resulting from transition testing is captured using scan elements 100 of multiple scan chains are also possible and contemplated.

In the embodiment shown, each of one or more scan elements 100 includes a NAND gate 101 or equivalent circuitry. The inputs to NAND gate 101 in this case are the Q output and the scan enable input, with its output being provided as the scan data output ('SDO'). This configuration may enable power savings when scan test operations are not in progress, as SDO is held at logic 1 (due to the scan enable input being a logic 0) and thus does not toggle responsive to changing inputs on scan element 100.

An alternate embodiment is illustrated in FIG. 2B, in which the scan elements 100 do not include the power-saving circuitry incorporated into the embodiment of FIG. 2A. Thus, the embodiment of FIG. 2B may be implemented without the use of the extra scan element 100-A.

Returning to FIG. 2A, memory array 12 is configured to store words having N+1 bits in embodiment shown, and thus the number of scan elements 100 in this subset is also N+1. The additional scan element 100-A is provided in this embodiment to enable transition testing to be conducted at the operational speed of the functional clock signal ('elk').

It is noted that embodiments that do not include scan control unit 98 for asserting the scan enable and transition test mode signals are possible and contemplated. In one possible embodiment, the scan enable and transition test enable signals may be provided from an external source (e.g., and IC test system) through dedicated pins. Another embodiment will now be discussed in further detail with reference to FIG. 3.

In the embodiment shown in FIG. 3, logic circuit 99 may assert the transition scan enable responsive to either the assertion of the scan enable signal provided to one of its inputs, or a logic 1 provided to its other input from the Q output of scan element 100-B. Accordingly, transition testing may be set up by shifting logic 1's into scan elements 100-B and 100-C. After the test stimulus data has been shifted in (including the logic 1's into scan elements 100-B and 100-C), the scan enable signal may be deasserted, thus inhibiting scan shifting in scan element 100-B and 100-C. Responsive to the functional clock cycles provided during transition testing, logic 1's may be provided on the Q outputs of scan elements 100-B and 100-C. On the first functional clock cycle of the transition test, the logic 1 from the Q output of 100-B may cause logic gate 99 to assert the transition scan enable signal to scan element 100-A and scan elements 100 that are coupled to memory array 12. At the same time, the logic 1 on the Q output of scan element 100-C may propagate to the D input of scan element 100-B. On the second functional clock cycle of the transition test, scan element 100-B may propagate the logic 1 received from scan element 100-C on the previous clock cycle, thereby causing logic gate 99 to keep the transition scan enable signal asserted. The transition testing may complete after two functional clock cycles, and thus on the next functional clock cycle received, the logic 0 hardwired to the D input of scan element 100-C may be provided on the Q output of scan element 100-B.

Responsive to both the first and second clock cycles, scan elements 100 that are coupled to memory array 12 may propagate logic values to logic circuitry 18. Furthermore, the logic values provided on the first clock cycle may be complementary to those logic values provided on the second clock cycle such that logic circuitry 18 may respond to a logical transition. The effect of the logical transitions may be captured by scan elements of other chains and shifted from that scan chain for observation and analysis.

It is noted that while the transition discussed above (and to be discussed below) is performed over two clock cycles, transition testing conducted over three or more clock cycles is also contemplated within the scope of this disclosure. Such transition testing may test the ability of circuitry to perform multiple low-to-high and/or high-to-low transitions at the functional clock speed of the circuit.

Figure 4:
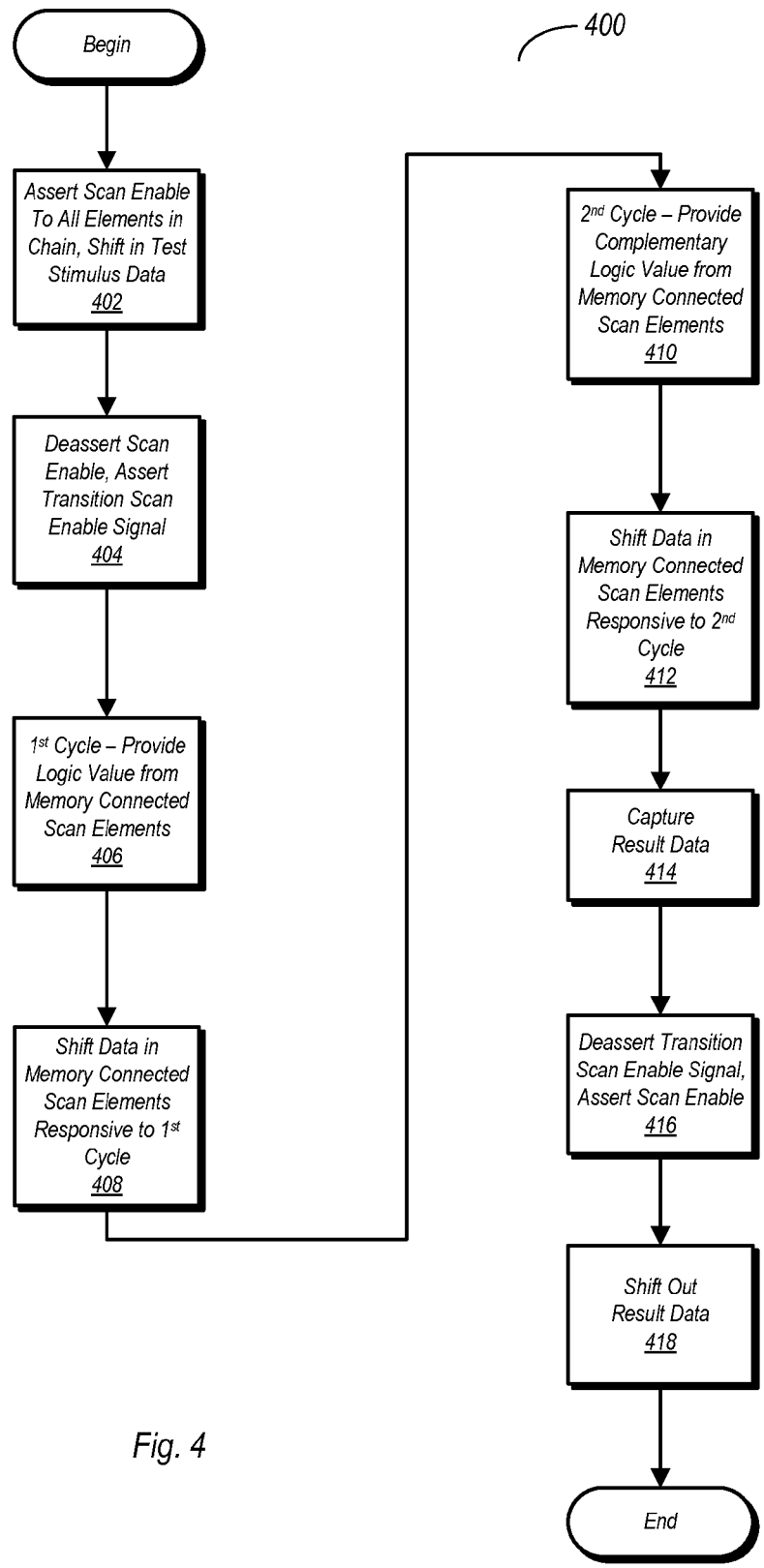
FIG. 4 is a flow diagram illustrating a method for performing transition testing using scannable elements.

Method Flow and Timing:

FIG. 4 is a flow diagram illustrating a method for performing transition testing using scannable elements. Method 400 as discussed herein may be applied to any of the IC/scan chain embodiments discussed above with reference to FIGS. 1-3. Method 400 may also be used with other embodiments that include transition testing capabilities as discussed herein.

Method 400 begins with the assertion of a scan enable signal, which may be applied globally to the elements in a scan chain, and the shifting in of test stimulus data. It is noted that some of the scan elements (e.g., scan elements 100 and 100-A shown in FIG. 2A) may received the scan enable signal indirectly, via a logic circuit that asserts a second scan enable signal (e.g., the transition scan enable signal) responsive to assertion of the global scan enable signal. Nevertheless, the assertion of the global scan enable signal may result in the assertion of a signal on the scan enable input of each element in the scan chain.

After test stimulus data has been shifted into the scan chain, transition testing may be initiated by deasserting the scan enable signal and asserting the transition scan enable signal (block 404). The transition scan enable signal may be applied to scan elements 100 having respective data inputs coupled to a memory, such as those shown in FIGS. 2A, 2B and 3 above. One or more additional scan elements 100 that support transition testing (e.g., scan element 100-A) of the scan chain may also receive the transition scan enable signal.

Subsequent to assertion of the transition scan enable signal, transition testing may begin by providing a first functional clock cycle. Responsive to providing the first functional clock cycle, the memory-connected scan elements 100 may provide a first logic value to correspondingly coupled logic circuitry (block 406). In addition, scan shifting (i.e. from an SDO of one scan element to the SDI of the next scan element) may also be performed responsive to the first clock cycle (block 408). Thus, scan shifting may be enabled for scan elements 100 and 100-A of FIGS. 2A and 3 during transition testing, in contrast to other scan elements 100 that are not coupled to receive the transition scan enable signal. The scan shifting operation that is performed during transition testing may set up the memory-connected scan elements 100 for the next functional clock cycle.

Responsive to a second functional clock cycle, each of the memory-connected scan elements 100 may provide a second logic value to correspondingly coupled logic circuits (block 410). A second shifting operation may also be performed responsive to the second clock cycle (block 412). The logic values provided responsive to the second functional clock cycle may be complements of those provided during the first functional clock cycle. This may have the effect of causing logical transitions in at least some of the correspondingly coupled logic circuits, assuming they are properly functioning. Thus, using the initially loaded test stimulus data responsive to the first functional clock cycle and the shifted test stimulus data responsive to the second functional clock cycle, the memory-connected scan elements may be able to provide stimulus for transition testing of correspondingly coupled logic circuits. The transition testing of these logic circuits may be useful for verifying the functionality of such logic circuits, as well as for detecting certain types of faults (e.g., stuck-at faults) for faulty circuits.

Following the second functional clock cycle, test result data may be captured (block 414). In one embodiment, a second scan chain may include scan elements coupled to capture test result data from the tested logic circuits. In another embodiment, the scan chain including the memory-connected scan elements 100 may also include additional scan elements coupled to capture the test result data from the tested logic circuits.

Following the capture of the test result data, the transition scan enable signal may be de-asserted and the global scan enable signal may be asserted once again (block 416). Assertion of the global scan enable signal may enable scan shifting for all the scan elements in the scan chain. Following the assertion of the global scan enable signal, the captured test result data may be shifted from the IC (block 418) to a test system or other type of system where subsequent observation and analysis may take place.

Figure 5:
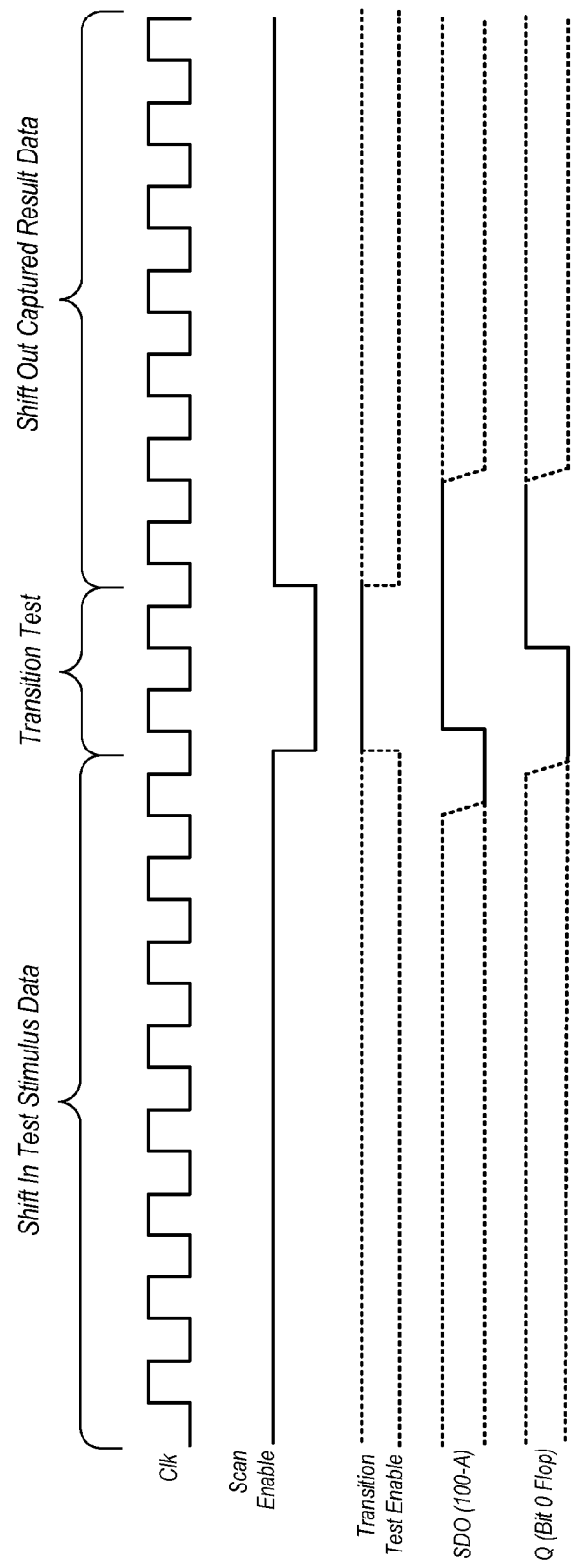
FIG. 5 is a timing diagram illustrating a method for performing transition testing using scannable elements.

Timing relationships involved in performing transition testing according to one embodiment are illustrated in FIG. 5. During a first phase, a global scan enable signal may be asserted, and test stimulus data may be shifted into the scan chain responsive to a number of functional clock cycles. Once the shifting in of test stimulus data is complete, the global scan enable may be deasserted. In some embodiments, the transition test enable signal may be asserted when the scan enable signal is deasserted. In other embodiments, the transition test enable signal may remain asserted throughout the shifting operations occurring both before and after the functional clock cycles of the transition test, as well as during the transition test itself. In either case, a transition scan enable signal may be asserted and provided to appropriate scan elements 100 during transition testing, responsive to assertion of the transition test enable signal.

In the example shown, test stimulus data provide to scan element 100-A may initially cause that element to provide a first logic value on its scan data output, while the Q output of the next scan element in the chain (i.e. that which is coupled to receive bit 0 of the memory) may also output a logic 0. Responsive to a first functional clock cycle during the transition test, the scan data output of scan element 100-A may transition to a logic 1. Meanwhile, the scam element coupled to receive bit 0 of the memory may output the logic 0 to logic circuitry coupled thereto. Responsive to a second functional clock signal during the transition test, the Q output of the scan element coupled to receive bit 0 from the memory may transition to a logic 1 due to the logic 1 received from scan element 100-A. Similar transitions may occur on the Q outputs of the remaining scan elements coupled to the memory array. On some of the logic elements, the transition may be from a logic 1 to a logic 0.

After the second functional clock cycle, the transition scan enable signal may be deasserted and the scan enable signal may be asserted once again. The functional clock may begin cycling at this point, thereby shifting out the captured result data, which may be received in a test system or other system.

Figure 6:
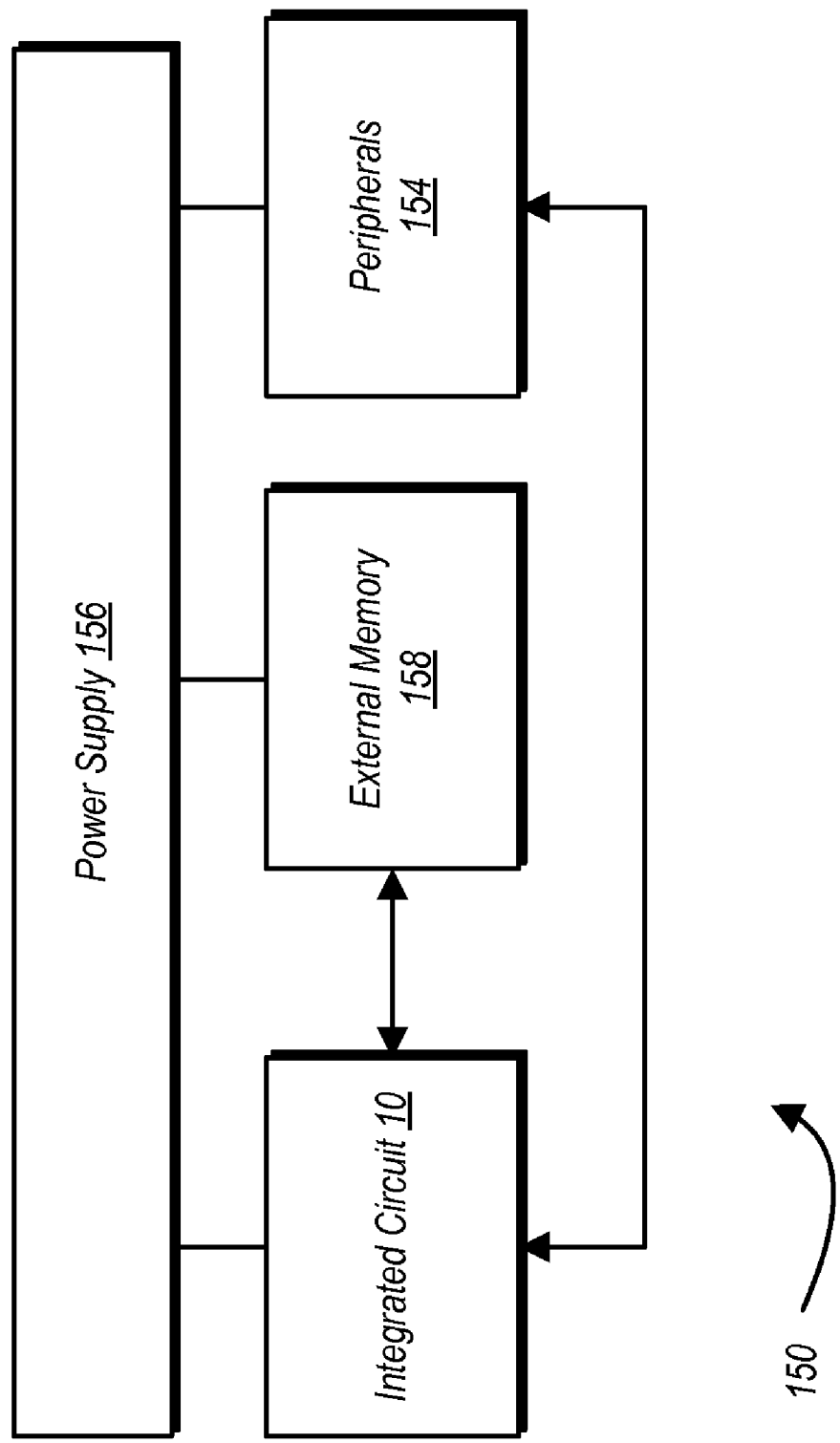
FIG. 6 is a block diagram of one embodiment of a system.

Exemplary System:

Turning next to FIG. 6, a block diagram of one embodiment of a system 150 is shown. In the illustrated embodiment, the system 150 includes at least one instance of an IC 10 (from FIG. 1) coupled to one or more peripherals 154 and an external memory 158. A power supply 156 is also provided which supplies the supply voltages to the IC 10 as well as one or more supply voltages to the memory 158 and/or the peripherals 154. Thus, the power supply 156 may include the voltage regulator 18 shown in FIG. 1. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a scan chain having a plurality of scan elements, each of the plurality of scan elements having a scan enable input; and
a logic circuit coupled to provide a first enable signal on the scan enable input of a first subset of the plurality of scan elements and a second enable signal on the scan enable input of a remaining subset of the plurality of scan elements, wherein the logic circuit is configured to assert the first enable signal during scan shifting operations and to deassert the first enable signal during functional clock cycles of a transition test operation, and wherein the logic circuit is configured to assert the second enable signal during both the scan shifting operation and the functional clock cycles.

2. The integrated circuit as recited in claim 1, wherein the integrated circuit includes a memory array, and wherein a data input of each of the remaining subset of the plurality of scan elements is coupled to receive data from the memory array.

3. The integrated circuit as recited in claim 1, wherein a data output of each of the remaining subset of the plurality of scan elements is coupled to a combinational logic circuit.

4. The integrated circuit as recited in claim 1, wherein the logic circuit is coupled to receive the first enable signal and a transition test mode signal, wherein the logic circuit is configured to provide the second enable signal to the remaining subset of the plurality of elements responsive to assertion of the first enable signal, and further configured to provide the second enable signal to the remaining subset of the plurality of scan elements responsive to assertion of the transition test mode signal.

5. The integrated circuit as recited in claim 4, wherein a data output of one of the first subset of the plurality of scan elements is coupled to convey the second scan enable signal to the logic circuit during the transition test operation.

6. A method comprising:
shifting test stimulus data through a scan chain having a plurality of serially-coupled scan elements in response to assertion of a first scan enable signal;
deasserting the first scan enable signal to perform a plurality of functional clock cycles of a transition test;
for a subset of the plurality of scan elements:
asserting a second scan enable signal;
shifting data through the subset of the plurality of scan elements in response to assertion of the second scan enable signal during the functional clock cycles.

7. The method as recited in claim 6, further comprising each of the subset of the plurality of scan elements providing data from respective data outputs to combinational logic circuits responsive to the functional clock cycles.

8. The method as recited in claim 6, further comprising inhibiting shifting through ones of the plurality of scan elements that are not included in the subset of the plurality of scan elements.

9. The method as recited in claim 6, further comprising providing the second scan enable signal to the subset of the plurality of scan elements from a logic circuit coupled to receive the first and second scan enable signals.

10. The method as recited in claim 9, further comprising one of the plurality of scan elements providing the second scan enable signal to an input of the logic circuit.

11. An integrated circuit comprising:
a memory array;
a scan chain comprising a plurality of serially coupled flops, wherein each flop of a first subset of the plurality of flops includes a data input coupled to the memory array; and
a logic circuit configured to convey a first scan enable signal to a respective scan enable input of each of the first subset during scan shifting operations, and further configured to convey a second scan enable signal to each flop of the first subset during launch and capture cycles of a transition test, wherein the flops of the first subset are configured to perform scan shifting during the launch and capture cycles.

12. The integrated circuit as recited in claim 11, wherein the scan chain includes a second subset of serially coupled flops, wherein flops of the second subset are coupled to receive the first scan enable signal but not the second scan enable signal, and wherein the flops of the second subset are further configured to inhibit scan shifting when the first scan enable signal is deasserted.

13. The integrated circuit as recited in claim 12, wherein the logic circuit is coupled to receive a data output from one of the flops of the second subset, wherein the one of the flops of the second subset is configured to convey the second scan enable to the logic circuit during the launch and capture cycles.

14. The integrated circuit as recited in claim 12, wherein each flop of the second subset is configured to provide data from a respective data output to a respectively coupled first logic circuit during the launch cycle, and further coupled to receive data at a respective data input from a respectively coupled second logic circuit during the capture cycle.

15. The integrated circuit as recited in claim 11, wherein each flop of the first subset is configured to, during the launch cycle, convey a first logic signal having a first logic level to a respectively coupled combinational logic circuit, and further configured to, during the capture cycle, convey a second logic signal having a second logic level to the respectively coupled combinational logic circuit.

16. A method comprising:
    asserting and providing a first scan enable signal to each of a plurality of serially coupled flops, the plurality of serially coupled flops including a first subset of flops each having a data input coupled to a memory array, and a second subset of flops each having a data input coupled to one of a plurality of logic circuits;
    scan shifting test stimulus data through the serially coupled flops while the first scan enable signal remains asserted;
    deasserting the first scan enable signal;
    asserting and providing a second scan enable to each of the first subset of flops but not the second subset of flops; and
    scan shifting data through the first subset of flops during responsive to each of first and second cycles of a clock signal while the second scan enable signal remains asserted.

17. The method as recited in claim 16, further comprising inhibiting scan shifting of data through the second subset of flops while the second scan enable signal remains asserted.

18. The method as recited in claim 16, further comprising each flop of the first subset providing, from a respective data output to a respectively coupled logic circuit, first and second logic signals, the first and second logic signals having complementary logic values.

19. The method as recited in claim 16, further comprising the flops of the first subset providing data to a first set of logic circuits responsive to the first clock cycle and capturing data from a second set of logic circuits responsive to the second clock cycle.

20. The method as recited in claim 16, further comprising:
    deasserting the second scan enable signal responsive to completion of the second clock signal;
    asserting the first scan enable signal subsequent to deasserting the second scan enable signal; and
    shifting test result data through the plurality of serially coupled scan flops.

21. A system comprising:
    a plurality of serially coupled scannable flops, wherein each of the plurality of scannable flops includes:
        a data input;
        a data output;
        a scan data input;
        a scan data output; and
        a scan enable input;
        wherein the scan data input of all but one of the plurality of scannable flops is coupled to the scan data output of another one of the plurality of scannable flops; and
    a memory array, wherein the data input of each of a first subset of the plurality of scannable flops is coupled to the memory array; and
    logic circuitry, wherein the data input of each of a second subset of the plurality of scannable flops is coupled to the logic circuitry;
    wherein the scan enable input of each of the first subset of scannable flops is coupled to selectively receive one of a first scan enable signal and a second scan enable signal, and wherein, when the second scan enable signal is asserted, shifting is enabled for each of the first subset of scannable flops and inhibited for each of the second subset of scannable flops.

22. The system as recited in claim 21, wherein the output of each of the plurality of scannable flops is coupled to the logic circuitry.

23. The system as recited in claim 21, wherein the logic circuitry includes at least one logic gate coupled to selectively convey the one of the first and second scan enable signals to each of the first subset of scannable flops.

24. The system as recited in claim 23, wherein the second subset of scannable flops includes at least one flop coupled to an input of the at least one logic circuit, wherein the at least one flop of the second subset is configured to convey the second scan enable signal to the at least one logic circuit.

25. The system as recited in claim 21, wherein each of the first set of scannable flops is configured to convey two consecutive logic signals having complementary logic values to the logic circuitry during first and second functional clock cycles when the second scan enable signal is asserted.

* * * * *